(12) United States Patent
Park

(10) Patent No.: US 8,085,593 B2
(45) Date of Patent: Dec. 27, 2011

(54) METHOD OF INPUTTING ADDRESS IN NONVOLATILE MEMORY DEVICE AND METHOD OF OPERATING THE NONVOLATILE MEMORY DEVICE

(75) Inventor: Young Soo Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 73 days.

(21) Appl. No.: 12/468,968

(22) Filed: May 20, 2009

(65) Prior Publication Data

US 2009/0290433 A1 Nov. 26, 2009

(30) Foreign Application Priority Data

May 20, 2008 (KR) .......................... 10-2008-0046601

(51) Int. Cl.
*G11C 16/04* (2006.01)
(52) U.S. Cl. .......... 365/185.11; 365/185.18; 365/230.06

(58) Field of Classification Search ............. 365/185.11, 365/185.18, 230.06
See application file for complete search history.

(56) References Cited

U.S. PATENT DOCUMENTS 5,835,448 A * 11/1998 Ohtani et al. ............... 365/233.1
2006/0203548 A1 * 9/2006 You ........................... 365/185.12

FOREIGN PATENT DOCUMENTS

KR 1020070027161 A 3/2007

OTHER PUBLICATIONS

Notice of Allowance issued from Korean Intellectual Property Office on Mar. 31, 2010.

* cited by examiner

*Primary Examiner* — Huan Hoang
(74) *Attorney, Agent, or Firm* — IP & T Group LLP

(57) ABSTRACT

A method of inputting address in a nonvolatile memory device includes inputting a row address including an information for selecting a memory block and an information for selecting a page, and inputting a column including an information for selecting a column and an information for selecting a plane.

13 Claims, 2 Drawing Sheets

|  |  | IO[0] | IO[1] | IO[2] | IO[3] | IO[4] | IO[5] | IO[6] | IO[7] |
|---|---|---|---|---|---|---|---|---|---|
| Column | 1 cycle | A0 | A1 | A2 | A3 | A4 | A5 | A6 | A7 |
|  | 2 cycle | A8 | A9 | A10 | A11 | L | L | L | L |
| Row | 3 cycle | A12 | A13 | A14 | A15 | A16 | A17 | A18 | A19 (Plane Add) |
|  | 4 cycle | A20 | A21 | A22 | A23 | A24 | A25 | A26 | A27 |
|  | 5 cycle | A28 | A29 | A30 | L | L | L | L | L |

FIG. 3

|  |  | IO[0] | IO[1] | IO[2] | IO[3] | IO[4] | IO[5] | IO[6] | IO[7] |
|---|---|---|---|---|---|---|---|---|---|
| Row (R_Add) | 1 cycle | A13 | A14 | A15 | A16 | A17 | A18 | A19 | A20 |
| | 2 cycle | A21 | A22 | A23 | A24 | A25 | A26 | A27 | A28 |
| | 3 cycle | A29 | A30 | L | L | L | L | L | L |
| Column (C_Add) | 4 cycle | A0 | A1 | A2 | A3 | A4 | A5 | A6 | A7 |
| | 5 cycle | A8 | A9 | A10 | A11 | A12 (Plane Add) | L | L | L |

METHOD OF INPUTTING ADDRESS IN
NONVOLATILE MEMORY DEVICE AND
METHOD OF OPERATING THE
NONVOLATILE MEMORY DEVICE

CROSS-REFERENCES TO RELATED
APPLICATIONS

The present application claims priority to Korean patent application number 10-2008-0046601, filed on May 20, 2008, which is incorporated by reference in its entirety.

BACKGROUND OF THE INVENTION

The present invention relates to a method of inputting addresses in a nonvolatile memory device and, more particularly, to a method of inputting addresses in a nonvolatile memory device including one or more planes and a method of operating a nonvolatile memory device using the same.

A semiconductor memory device is a memory device that is able to store data and read stored data, if appropriate. Semiconductor memory devices include volatile memory, which loses stored data when power is off, and nonvolatile memory, which can retain stored data although power is off. Flash memory among the nonvolatile memory devices has the function of electrically erasing data of cells in a lump, and has been widely used in computers, memory cards, and so on.

Flash memory is divided into a NOR type and a NAND type according to bit lines of a cell and connection status thereof. NOR type flash memory has a structure in which two or more cell transistors are connected in parallel to one bit line, and is configured to store data using the channel hot electron method and erase data using the Fowler-Nordheim (F-N) tunneling method. NAND type flash memory has a structure in which two or more cell transistors are connected in series to one bit line, and is configured to store and erase data using the F-N tunneling method. In general, NOR type flash memory is disadvantageous in the high integration because of great current consumption, but is advantageous in that it can easily cope with a high speed. NAND type flash memory is advantageous in the high integration because it uses a low cell current when compared with NOR type flash memory.

A nonvolatile memory device, such as the above-described flash memory device, receives a program command, address information of a memory cell in which data will be stored, and data to be programmed in order to perform a program operation, and performs the program operation. In order to read data stored in a nonvolatile memory device, a data read command and an address of a memory cell from which data will be read are received, and a data read operation is performed.

At this time, the address information input to the nonvolatile memory device largely consists of a column address 'C_Add' and a row address 'R_Add'. When a nonvolatile memory device includes one or more planes, the address information further includes a plane address. In general, the plane address is input when the row address 'R_Add' is input.

Meanwhile, a nonvolatile memory device having one or more planes typically operates on a page basis. A method of operating a page of two or more planes at the same time was developed. Thus, a nonvolatile memory device having two planes can operate on a page basis as if it has a twice page size.

Meanwhile, even when the size of a page itself increases, a nonvolatile memory device is sometimes implemented to input and output data at half size of a unit page for the purpose of compatibility with a system using a nonvolatile memory device having a page of a previous size.

In order to implement data input/output with respect to two or more planes or an operation of storing and outputting data with respect to one page by dividing it twice or more as described above, an input/output operation of data should be performed twice or more using a new command.

FIG. 1 shows an address configuration of a general nonvolatile memory device.

Referring to FIG. 1, an address input for program or data read of a nonvolatile memory device comprises five address cycles. Two column address cycles are first input, and three row address cycles are then input.

Here, the address cycles are input sequentially through an Address Latch Enable (ALE) pin of the nonvolatile memory device and IO pins [7:0]. At this time, when a row address is input, the address of a plane is input. As shown in FIG. 1, the address of a plane is input through IO pin [7] at a third address cycle. Further, data input and output of a nonvolatile memory device are consecutively performed as many as a predetermined number from an input column address according to the input address information. There is a random data input/output operation for partially executing data input/output discontinuously by changing column addresses.

In order to perform the random data input/output operation, when an address is input, only column address input is performed, but row address input is omitted.

In the case in which a nonvolatile memory device has two planes, command input for data read and program operations is as follows.

In order to read data, a data read command '00h', address information about a first plane, and an execution command '30h' are first input. Next, a data read command '00h', address information about a second plane, and an execution command '30h' are input.

After the data read commands of the first plane and the second plane are input, a nonvolatile memory device reads data by performing a sensing operation internally and outputs the read data to the outside.

At this time, in order to output data, if the command '00h', address information about a desired plane, and a random data output command are input, data read by the random data output operation is output. The random data output operation is performed to output data discontinuously while changing column addresses, so only the column addresses are input in order to perform the operation.

When performing an operation for programming data, a program command '80h', address information about the first plane, data to be programmed, and an execution command '11h' are first input. Next, a program command '81h', address information about the second plane, data to be programmed, and an execution command '10h' are input. That is, when data is input to each plane, all the five cycles of the address information must be input.

Further, when performing an erase operation, only the three cycles of the row address are input when the addresses of the first and second planes are input.

As described above, in order to input each plane address when a nonvolatile memory device including two or more planes performs program, read and erase operations, all the five cycles of the address information must be input or the three cycles of the row addresses must be input. Accordingly, the address input process is complicated and unnecessary addresses can be input.

In particular, in the case in which the random data input/output method is employed, there is no problem in performing an operation although only the column addresses are input as mentioned earlier. However, in order to input the address of a plane, row addresses must be input unnecessarily. In order to obviate such inconvenience, a new command is required or a user must input an address so as to repeatedly perform an existing command. However, this process is very complicated.

BRIEF SUMMARY OF THE INVENTION

The present invention is directed towards a method of inputting addresses in a nonvolatile memory device, which provides new formats of a column address, a row address, and a plane address in order to simplify an operation of a nonvolatile memory device having two or more planes, and a method of operating the nonvolatile memory device.

According to an aspect of the present invention, there is provided a method of inputting address in a nonvolatile memory device, including inputting a row address including an information for selecting a memory block and an information for selecting a page, and inputting a column address including an information for selecting a column and an information for selecting a plane.

The row address is comprised of N (N is a positive integer) bits, and the column address is of M (M is a positive integer) bits.

The plane address is included in first to $K^{th}$ bits of first to $M^{th}$ bits constituting the column address, where K is a positive integer.

The plane address is included in $(M-K+1)^{th}$ to $M^{th}$ bits of first to $M^{th}$ bits constituting the column address, where K is a positive integer.

According to another aspect of the present invention, there is provided a method of operating a nonvolatile memory device, including inputting a data read command, first address information including first plane address information, and an execution command, inputting a data read command, second address information including second plane address information, and an execution command, and performing a random data output by inputting only a column address, including the first or second plane address, together with a random data output command for outputting data read by the data read command.

The first or second address information includes a row address comprising N (N is a positive integer) bits, and a column address comprising M (M is a positive integer) bits including the plane address information.

In executing the random data output command, the column address of the M bits including the plane address information is input.

The plane address comprises K (K is a positive integer, K<M) bits of the column address of the M bits.

According to still another aspect of the present invention, there is provided a method of operating a nonvolatile memory device, including inputting a data read command, first address information, and an execution command, performing data reading on first and second planes based on the first address information in accordance with the input execution command, and inputting a random data output command with respect to the first and second planes in response to the read data, and a column address including a first or second plane address.

The first address information includes a row address and a column address, and the column address includes the first or second plane address.

In executing the random data output command, the column address including first or second plane address information is input.

According to still another aspect of the present invention, there is provided a method of operating a nonvolatile memory device, including inputting a program command and a row address, inputting a random data input command and an execution command, and executing a random data input operation on a plurality of planes by inputting a column address, including a plane address, and data to be programmed in accordance with the random data input command.

The method further includes inputting an erase command, a row address, and a column address and inputting an execution command, and performing erasure on a memory block of a plane selected according to the row address and the column address.

BRIEF DESCRIPTION OF THE DRAWINGS

FIG. 3 is an address configuration of a nonvolatile memory device in accordance with an embodiment of the present invention.

DESCRIPTION OF SPECIFIC EMBODIMENT

Figures 1, 2:
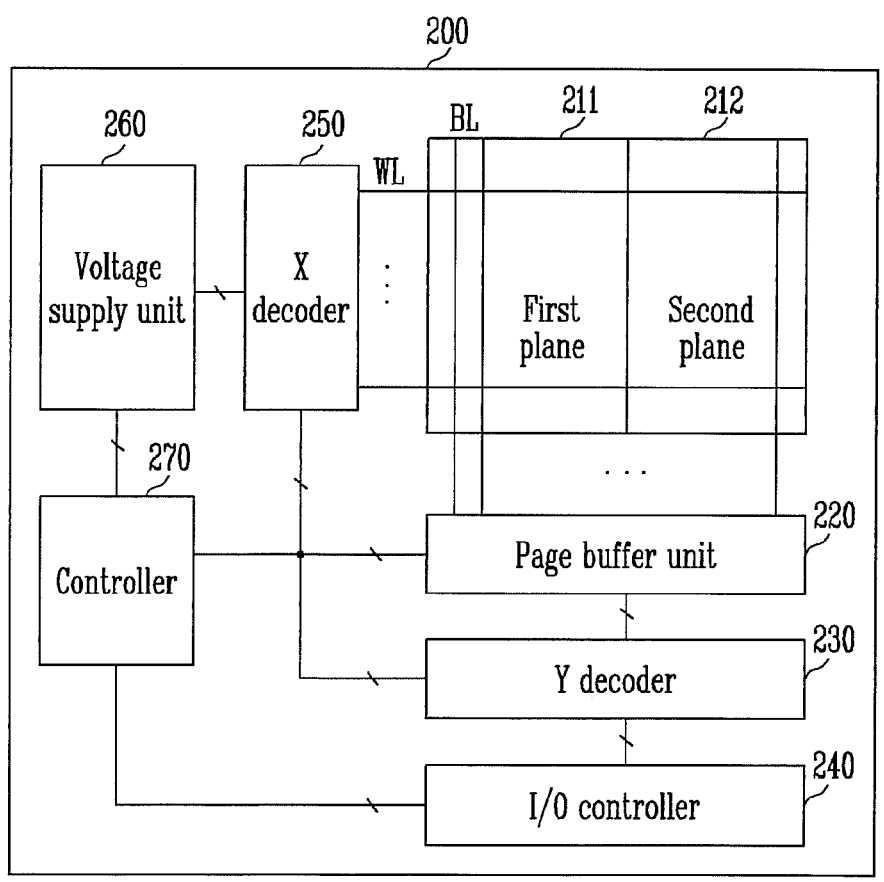
FIG. 1 shows an address configuration of a general nonvolatile memory device.
FIG. 2 is a block diagram of a nonvolatile memory device in accordance with an embodiment of the present invention.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention.

FIG. 2 is a block diagram of a nonvolatile memory device in accordance with an embodiment of the present invention.

Referring to FIG. 2, a nonvolatile memory device 200 includes first and second planes 211, 212, a page buffer unit 220, a Y decoder 230, an I/O controller 240, an X decoder 250, a voltage supply unit 260, and a controller 270.

Each of the first and second planes 211, 212 includes memory cells for storing data, which are connected to word lines and bit lines. One or more bit lines are connected to a page buffer circuit. The page buffer circuit is configured to store to-be-programmed data in a memory cell connected to a selected bit line, or read data stored in a memory cell and store the read data. The page buffer unit 220 includes the page buffer circuits.

The Y decoder 230 provides a data input/output path of the page buffer circuits according to an input address. The I/O controller 240 is coupled to the outside and controls the input and output of data.

The X decoder 250 selects word lines in response to an input address. The voltage supply unit 260 generates operation voltages necessary for operations, such as program, read and erasure of the nonvolatile memory device 200, and provides the generated voltages to the nonvolatile memory device 200.

The controller 270 controls an operation of the nonvolatile memory device 200 by controlling operations of the page buffer unit 220, the Y decoder 230, the I/O controller 240, the X decoder 250, and the voltage supply unit 260.

The controller 270 determines whether data input to the I/O controller 240 is command data, address information or data using an algorithm embedded therein. The controller 270 receives the data command and the address information and then issues an operation command.

The controller 270 controls the data to be input to the page buffer circuit through the Y decoder 230.

When address information is input, the controller 270 distinguishes row addresses and column addresses according to an input sequence. The controller 270 then checks a plane address included in the column addresses and outputs control signals for selecting a plane for an operation and for selecting a word line and a bit line.

Addresses input to the controller 270 in accordance with an embodiment of the present invention are configured as follows.

FIG. 3 is an address configuration of a nonvolatile memory device in accordance with an embodiment of the present invention.

Referring to FIG. 3, address information comprises of five cycles including a column address 'C_Add' of two cycles and a row address 'R_Add' of three cycles. Here, plane address information is included in the column address 'C_Add'.

At this time, the former first to third cycles are comprised of the row address 'R_Add', and the latter fourth and fifth cycles are comprised of the column address 'C_Add'.

Here, the bit number of the column address comprising the fourth and fifth cycles is decided by a page size, a main cell, a spare cell, and whether the bit number of data input and output at once is 8 bits or 16 bits. In general, data input and output at once in a nonvolatile memory device is smaller than 16 bits.

Thus, in the case in which the nonvolatile memory device according to an embodiment of the present invention sequentially performs data input/output operations through an ALE pin and IO[7:0], the input of the column address 'C_Add' becomes a maximum of 16 bits. Therefore, the column address 'C_Add' can be sufficiently included in the fourth and fifth cycles.

In accordance with an embodiment of the present invention, the column address 'C_Add' included in the fourth and fifth cycles can be represented by CA[15:0]. Of them, the number that can be actually used as column addresses is 12. Therefore, the actual column address 'C_Add' can be represented by CA[11:0] and the remaining CA[15:12] are fixed to 0 bits.

In the column address 'C_Add', CA[7:0] is input at the fourth cycle and CA[15:8] is input at the fifth cycle. Further, in the address input method in accordance with an embodiment of the present invention, a plane address is included in CA[12]. In an alternative embodiment, the plane address can be included in the first bit CA[0] and column addresses can be then input.

Therefore, addresses input for the purpose of an operation of a nonvolatile memory device in accordance with an embodiment of the present invention can be divided into a row address and a column address. A plane address is represented by redundant bits of a number of address bits comprising the column address.

Further, in the sequence of addresses input for an operation of the nonvolatile memory device, the row address is first input and the column address is then input.

The above address input method is configured as shown in FIG. 3.

When inputting addresses as in FIG. 3, a command input for an operation of the nonvolatile memory device is as follows.

First, it is assumed that a nonvolatile memory device in accordance with an embodiment of the present invention includes two planes.

In order to read data, a data read command '00h', and address information and an execution command '30h' of a first plane are first input. A data read command '00h', and address information and an execution command '30h' of a second plane are then input.

In order to output data, only a random data output command is input. Since plane address information is included in a column address input when performing a random data output, it is not necessary to separately input an address of five cycles for informing a plane address.

Therefore, when representing all commands input for a data read operation, the data read command '00h', and the address information and the execution command '30h' of the first plane are first input. The data read command '00h', and the address information and the execution command '30h' of the second plane are then input. A random data output command is further input.

As another method, after the data read command '00h', the address information and an execution command '32h' are input, a random data output command is input. At this time, the execution command '32h' is a command that is newly defined in order to read two planes.

That is, data can be randomly read from the first plane and the second plane according to the execution command '32h'.

For the purpose of a data program operation in accordance with an embodiment of the present invention, a program command '80h', row address information, a random data input command, and an execution command '10h' are input. At this time, a column address can be input while performing the random data input command. Since the column address includes a plane address according to an embodiment of the present invention, a data program operation in two planes can be performed.

Therefore, if a row address is first input at once and only a column address is then input by a random data input operation, an input of a plane address may be added. Accordingly, a program operation can be performed while an address input becomes simple.

Finally, when performing an erase operation of a nonvolatile memory device in accordance with an embodiment of the present invention, not only a row address, but a column address must be input in order to designate a plane and block to be erased.

As described above, in accordance with the method of inputting addresses in a nonvolatile memory device and the method of operating the nonvolatile memory device according to the present invention, a plane address is included in a column address. Accordingly, an address input can become simplified, the time taken for the address input can be reduced, and an overall operation time can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of inputting an address in a nonvolatile memory device, the method comprising:
    inputting a row address including information for selecting a memory block and information for selecting a page in a row address input cycle;
    inputting a column address and a plane address in a column address input cycle; and
    performing a random data output during the column address input cycle in response to a random data output command.

2. The method of claim 1, wherein the row address is comprised of N (N is a positive integer) bits, and the column address is comprised of M (M is a positive integer) bits.

3. The method of claim 2, wherein the plane address is included in first to $K^{th}$ bits of first to $M^{th}$ bits constituting the column address, where K is a positive integer.

4. The method of claim 2, wherein the plane address is included in $(M-K+1)^{th}$ to $M^{th}$ bits of first to $M^{th}$ bits constituting the column address, where K is a positive integer.

5. A method of operating a nonvolatile memory device, the method comprising:
inputting a data read command, first address information including first plane address information, and an execution command;
inputting a data read command, second address information including second plane address information, and an execution command; and
performing a random data output by inputting only a column address, including the first or second plane address, together with a random data output command for outputting data read by the data read command.

6. The method of claim 5, wherein the first or second address information includes a row address comprising N (N is a positive integer) bits, and a column address comprising M (M is a positive integer) bits including the plane address information.

7. The method of claim 6, wherein in executing the random data output command, the column address of the M bits including the plane address information is input.

8. The method of claim 7, wherein the plane address information comprises K (K is a positive integer, K<M) bits of the column address of the M bits.

9. A method of operating a nonvolatile memory device, the method comprising:
inputting a data read command, first address information, and an execution command;
performing data reading on first and second planes based on the first address information in accordance with the input execution command; and
inputting a random data output command with respect to the first and second planes in response to the read data, and a column address including a first or second plane address.

10. The method of claim 9, wherein:
the first address information includes a row address and a column address, and
the column address includes the first or second plane address.

11. The method of claim 9, wherein in executing the random data output command, the column address including first or second plane address information is input.

12. A method of operating a nonvolatile memory device, the method comprising:
inputting a program command and a row address;
inputting a random data input command and an execution command; and
executing a random data input operation on a plurality of planes by inputting a column address, including a plane address, and data to be programmed in accordance with the random data input command.

13. The method of claim 12, further comprising:
inputting an erase command, a row address, and a column address and inputting an execution command; and
performing erasure on a memory block of a plane selected according to the row address and the column address.

* * * * *